United States Patent [19]

Watt

[11] 3,936,557

[45] Feb. 3, 1976

[54] EPOXIDE BLEND FOR POLYMERIZABLE COATING COMPOSITIONS AND PROCESS

[75] Inventor: William Russell Watt, Princeton Junction, N.J.

[73] Assignee: American Can Company, Greenwich, Conn.

[22] Filed: Apr. 9, 1973

[21] Appl. No.: 349,487

Related U.S. Application Data

[62] Division of Ser. No. 144,668, May 18, 1971, Pat. No. 3,794,576.

[52] U.S. Cl............ 428/211; 204/159.11; 260/2 EP; 260/830 TW; 427/54; 427/53; 427/43; 427/44; 428/413
[51] Int. Cl.$^2$.......................................... B50D 3/06
[58] Field of Search................ 260/830 TW, 4 EP; 117/93.31, 161 ZB; 204/159.11

[56] References Cited
UNITED STATES PATENTS

| | | | |
|---|---|---|---|
| 3,205,157 | 9/1965 | Licari et al............... | 96/115 R |
| 3,632,843 | 1/1972 | Allen et al............... | 117/161 ZB |
| 3,692,560 | 9/1972 | Rosenkranz et al........ | 117/93.31 |
| 3,709,861 | 1/1973 | Anderson................. | 117/93.31 |
| 3,711,390 | 1/1973 | Feinberg................. | 117/93.31 |
| 3,711,391 | 1/1973 | Feinberg................. | 117/93.31 |
| 3,721,617 | 3/1973 | Watt..................... | 117/93.31 |

OTHER PUBLICATIONS

Lee et al. Handbook of Epoxy Resins McGraw-Hill Book Co. New York 1967 pp. 13-7 to 13-9.

*Primary Examiner*—J. H. Newsome
*Attorney, Agent, or Firm*—Robert P. Auber; Ernestine C. Bartlett; George P. Ziehmer

[57] ABSTRACT

A blend of epoxide materials is provided which, although essentially free of volatile solvents, is liquid and tractable for coating and related applications at or near room temperature. The epoxide materials include an epoxy prepolymer of the type of glycidyl-bisphenol A resins, epoxidized novolaks, polyglycidyl ethers, and alicyclic diepoxides, blended with a bis(epoxycycloalkyl) ester and in many cases also with a low viscosity monoepoxide in limited proportions. The compositions preferably include additionally a cationic polymerization initiator, preferably a radiation-sensitive catalyst precursor, and epoxide polymers are produced by coating such compositions on a substrate, followed by application of energy, through heating or preferably through irradiation, to effect substantial polymerization of the epoxidic materials of the coating.

33 Claims, No Drawings

EPOXIDE BLEND FOR POLYMERIZABLE COATING COMPOSITIONS AND PROCESS

This is a divisional of application Ser. No. 144,668, filed May 18, 1971 now U.S. Pat. No. 3,794,576.

BACKGROUND OF THE INVENTION

Coating, printing, and related processes conventionally are carried out by dissolving film-forming ingredients in a volatile solvent, applying the resulting composition to a substrate, and drying and curing the transferred material with or without heating, whereby the volatile solvent is released to the atmosphere. Evolution of the solvent tends to lengthen the hardening process and to leave voids and pinholes in the cured coatings, making them porous. Emission of volatile solvents tends to pollute the adjacent air unless costly arrangements are made to recover practically all of the solvent, and release of flammable volatile solvents may create fire and explosion hazards. Heating often is required to hasten removal of the solvent, but the higher temperatures produced may damage the substrate, or may cause running and deformation of the coating while it still is soft.

Solvent-free mixtures of epoxide materials may be prepared based essentially, for example, on certain epoxidic prepolymers such as the reaction products of epichlorohydrin with bisphenol A or with novolaks. Such prepolymers have been blended with various monoglycidyl ethers, or with a glycol diglycidyl ether, primarily to modify the viscosity of the prepolymer. Such mixtures can be shaped, as by coating, and then treated with an activated cationic initiator to cure the resin. However, these prepolymeric mixtures do not provide the rheological properties most desirable for certain coating or related operations, or are unsuited for application to various types of substrates. Coating and printing machines require unique combinations of properties to permit smooth and rapid flow of the coating and printing compositions through the machines for proper application to the substrate web or sheets supplied to the machines. It also has been observed that modification of the solvent-free epoxide materials with socalled reactive diluents, such as monoglycidyl ethers, to obtain the desired rheological properties tends to decrease the speed of curing and to diminish the hardness of the material after initiation of polymerization and curing, giving a more or less soft or tacky finish rather than a tough, solid finish. Efforts to avoid this problem by the inclusion of hardeners, such as amines, amides, or anhydrides, lead to premature curing immediately upon mixing and a tendency to brittleness in the cured material. It is an object of the present invention to provide epoxide blends suitable for use in polymerizable compositions, and to provide a related polymerizing process, which substantially avoid these difficulties and disadvantages encountered with prior materials and processes.

SUMMARY OF THE INVENTION

Accordingly, a new and improved blend of epoxide materials, fluid at room temperature, consists essentially of at least one epoxidic prepolymer material having an epoxy equivalent weight below 200, constituting between about 10% and 85% of the weight of the blend, and selected from the group consisting of an epoxy resin prepolymer consisting predominantly of the monomeric diglycidyl ether of bisphenol A, a polyepoxidized phenol or cresol novolak, a polyglycidyl ether of a polyhydric alcohol, and a diepoxide of a cycloalkyl or alkylcycloalkyl hydrocarbon or ether; the blend consists additionally of at least about 15% by weight of an epoxidic ester having two epoxycycloalkyl groups, and from 0–15% by weight of a monoepoxide having a viscosity at 23°C of less than 20 centipoises. Polymerizable compositions advantageously consist essentially of the above-specified ingredients and a radiation-sensitive catalyst precursor which decomposes upon application of energy to provide a Lewis acid catalyst effective to initiate polymerization of the abovementioned epoxidic materials. Such compositions are especially useful in providing rapidly curable coatings, which may contain no more than a few percent by weight of unpolymerizable materials. Thus, in accordance with the process of the invention, an epoxidized polymer is produced by forming a mixture of the epoxidic materials mentioned above and the catalyst precursor, applying the mixture so formed to a substrate, and subsequently applying energy to the mixture on the substrate to release the Lewis acid catalyst in sufficient amounts to effect substantial polymerization of the epoxidic materials.

DETAILED DESCRIPTION

There is provided and utilized, in accordance with the present invention, a blend of epoxide materials which is fluid at room temperature. This blend includes a material designated for convenience as a prepolymeric material, which is described in detail hereinbelow. The blend also includes an ester having two epoxycycloalkyl groups, designated for convenience as a bis-(epoxycycloalkyl) ester. The blend may include further, in limited quantities, a monoepoxide material of specified maximum viscosity. To provide a polymerizable composition, a cationic initiator is mixed or dissolved in the blend.

Prepolymeric material. The blend of epoxide materials, fluid at room temperature, contains at least one prepolymeric material having an epoxy equivalent weight below 200 and selected from the group consisting of (A) an epoxy resin prepolymer of the glycidyl-bisphenol A polyether type, (B) a polyepoxidized phenol or cresol novolak, (C) a polyglycidyl ether of a polyhydric alcohol, and (D) a diepoxide of a cycloalkyl or alkylcycloalkyl hydrocarbon or ether. This epoxidic prepolymer material constitutes between 10% and 85% of the weight of the blend.

Referring first to the resin prepolymer of the glycidyl-bisphenol A polyether type, (A), the classic epoxy resin is obtained by the well known reaction of epichlorohydrin (1-chloro-2,3-epoxypropane) and bisphenol A (4,4′-isopropylidene-diphenol). The reaction product is believed to have the form of a polyglycidyl or diglycidyl ether of bisphenol A (the glycidyl group being more formally referred to as the 2,3-epoxypropyl group) and thus may be thought of as a polyether derived from the diphenol and glycidol (2,3-epoxy-1-propanol). The structure usually assigned to the resinous product is

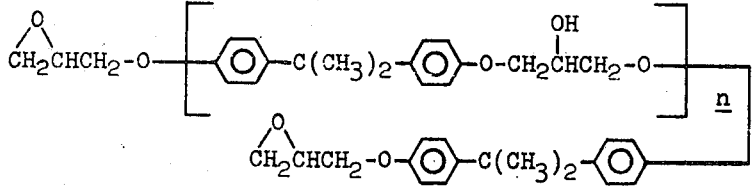

In this formula the glycidyl groups having non-terminal positions in the polymeric molecules become 2-hydroxytrimethylene groups, —CH$_2$CH(OH)CH$_2$—.

A viscous liquid epoxy resin, average molecular weight about 380, is obtained by reacting the epichlorohydrin in high molecular proportion relative to the bisphenol A, the reaction product containing well over 85 mole percent of the monomeric diglycidyl ether of bisphenol A ($n = 0$), which may be named 2,2-bis[p-(2,3-epoxypropoxy)phenyl]propane, and smaller proportions of polymers in which $n$ is an integer equal to 1, 2, 3, etc. The epoxy resin prepolymer utilized in accordance with the present invention is a product of the kind just mentioned, consisting predominantly of the monomeric diglycidyl ether of bisphenol A (probably at least 80 mole percent of the monomer, although this proportion is impractical to determine), having an average molecular weight below about 400, and having an epoxy equivalent weight in the range of 170 to 200, usually about 172 to 187. Ref.: *Handbook of Epoxy Resins*, H. Lee and K. Nevill, McGraw-Hill Book Company, 1967, pages 2-2 et seq. on "Synthesis of Glycidyl-type Epoxy Resins", particularly pages 2–3 and 2–4 on the synthesis of monomeric diglycidyl ether of bisphenol A.

Referring next to the phenol novolaks and cresol novolaks, (B), these products are made, following procedures well known in the phenol-formaldehyde resin art, by a condensation reaction involving formaldehyde and a commercial grade of cresol (or phenol) in excess amounts, using an acid catalyst, and yielding liquid or low-fusing thermoplastic products. Such products are available in epoxidized forms, having average molecular weights in the vicinity of 1,000 and epoxy equivalent weights in the range of 160 to 200, frequently about 170–180.

Referring to the polyglycidyl ethers of polyhydric alcohols, (C), a readily available example is the diglycidyl ether of 1,4-butanediol, also named 1,4-bis(2,3-epoxypropoxy)-butane, having the structural formula

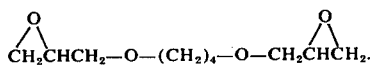

The epoxy equivalent weight of this compound when pure is 101.

Another diglycidyl ether of a glycol is diethylene glycol diglycidyl ether, also named bis[2-(2,3-epoxypropoxy)-ethyl] ether, having an epoxy equivalent weight of 109 and the structural formula

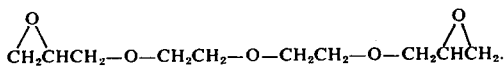

A further example of a polyglycidyl ether of a polyol is a diglycidyl or triglycidyl ether of glycerol; and triglycidyl ether is 1,2,3-tris(2,3-epoxypropoxy) propane, while the diglycidyl ethers are 2,3-bis(2,3-epoxypropoxy)-1-propanol and 1,3-bis(2,3-epoxypropoxy)-2-propanol. One readily available product is a mixture of the triglycidyl ether with one or both of the diglycidyl ethers, having an epoxy equivalent weight roughly midway between that of the triglycidyl ether, 87, and that of the diglycidyl ethers, 102. It is noted that the presence, for example, of the additional ether oxygen in diethylene glycol diglycidyl ether, or of the remaining alcoholic hydroxy group in the diglycidyl ethers of glycerol, does not detract from the suitability of these compounds having rather low epoxy equivalent weights as polyglycidyl ethers of polyols in the epoxide blends of the invention.

Referring to the diepoxides of cycloalkyl or alkylcycloalkyl hydrocarbons or ethers, (D), these epoxidic compounds may be illustrated by the following.

A diepoxide of an alkylcycloalkyl hydrocarbon is vinylcyclohexene dioxide, more specifically identified as 3-(epoxyethyl)-7-oxabicyclo[[4.1.0]heptane, or 1,2-epoxy-4-(epoxyethyl)cyclohexane, having an epoxy equivalent weight of 70 and the structural formula

A diepoxide of a cycloalkyl hydrocarbon is dicyclopentadiene dioxide, more specifically identified as 3,4-8,9-diepoxytricyclo[5.2.1.0$^{2,6}$]decane, having an epoxy equivalent weight of 82 and the structural formula

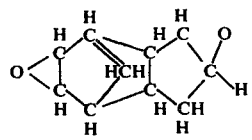

A diepoxide of a cycloalkyl ether is bis(2,3-epoxycyclopentyl) ether, otherwise named 2,2'-oxybis (6-oxabicyclo-[3.1.0]hexane), having an epoxy equivalent weight of 91 and the structural formula

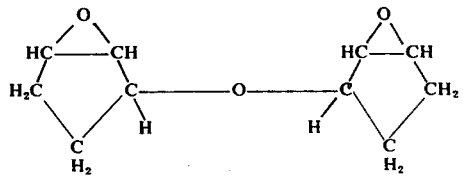

Bis(epoxycycloalkyl) ester. In addition to the epoxidic prepolymers (designated A–D) discussed hereinabove, the blend of epoxide materials includes also, admixed therewith, an ester having two epoxycycloalkyl groups. This diepoxidic alicyclic ester constitutes at least about 15% of the weight of the blend, and conveniently may be an ester of an epoxidized cyclic alcohol and an epoxidized cycloalkanecarboxylic acid. Thus, a suitable ester of epoxidized cyclohexanemethanol and epoxidized cyclohexanecarboxylic acid is the diepoxide (3,4-epoxycyclohexyl)methyl 3,4-epoxycyclohexanecarboxylate; this same ester may be indexed under the name 7-oxabicyclo[4.1.0]hept-3-ylmethyl 7-oxabicyclo[4.1.0]heptane-3-carboxylate, and has the formula

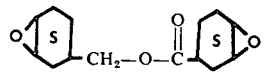

Another suitable ester having two epoxycycloalkyl groups may be obtained as an ester of an alkyl-substituted (epoxycycloalkane)methanol and a dibasic acid, for example, bis[(3,4-epoxy-6-methylcyclohexyl)methyl]adipate, which may be named alternatively bis[(4-methyl-7-oxabicyclo[4.1.0]hept-3-yl) methyl] adipate, and which has the formula

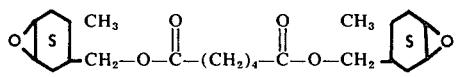

Monoepoxide material. The epoxide blend additionally may include a monoepoxide having a viscosity at 23°C of less than 20 centipoises, constituting not more than about 15% of the weight of the blend. Examples of suitable monoepoxides are the following:

Propylene oxide (1,2-epoxypropane),

Butylene oxide (1,2-epoxybutane),

Allyl glycidyl ether (1-allyloxy-2,3-epoxypropane),

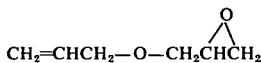

Butyl glycidyl ether (1-butoxy-2,3-epoxypropane),

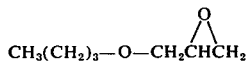

Glycidyl phenyl ether (1,2-epoxy-3-phenoxypropane),

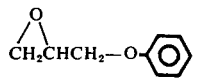

It will be appreciated that more than one such monoepoxidic compound may be utilized, provided that together these monoepoxides do not exceed the specified proportion of the weight of the epoxide blend or of the polymerizable composition. A readily available product is a mixture of ethers of the structure

where R is alkyl, that is, glycidyl alkyl ethers. One such mixture contains predominantly glycidyl octyl ether and decyl glycidyl ether, while another contains predominantly dodecyl glycidyl ether and glycidyl tetradecyl ether.

Still another useful type of monoepoxide material is a polyolefin (e.g., polyethylene) epoxide. Such epoxides are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxidation then provides mixtures of the corresponding 1,2-epoxyalkanes, examples being mixtures high in the 1,2-epoxy derivatives of alkanes having 11 to 14 carbons, or having 15 to 18 carbons.

Initiator. The blend of epoxide materials may be utilized promptly upon mixing for forming a body, film, or coating of desired shape and the curing thereof effected at once or later, or both of the shaping and the curing may be carried out at a later convenient time or different place. A polymerization initiator may be mixed into the body in a form which is immediately active, so that polymerization commences during the mixing and is completed within a few minutes. For many shapes such mixing cannot be achieved after carrying out the shaping, for example after making a coating, and rapid polymerization would interfere with or prevent the shaping. Accordingly, the initiator conveniently is mixed with the blend, to form a polymerizable composition, with the initiator in an inactive condition. Radiation-sensitive catalyst precursors are discussed hereinbelow. Catalyst precursors ordinarily will be present in the polymerizable compositions of the invention in amounts ranging from about 0.5% to about 2% of the total weight of the compositions less than 0.1% or more than 5% seldom being called for. The presence of several percent by weight, for example, of a catalyst precursor causes only a slight dilution of the epoxidic materials of the composition, so that the approximate limits specified hereinabove for the weight proportions of the various epoxides in the epoxide blend ordinarily are not changed substantially, when calculated as weight proportions of the entire composition, by the addition of a catalyst precursor.

Suitable radiation-sensitive catalyst precursors decompose to provide a Lewis acid upon application of energy. The energy required for effective decomposition likewise may be energy applied by bombardment with charged particles, notably by high-energy electron beam irradiation. However, the catalyst precursors described hereinbelow are primarily photosensitive, and the required energy is imparted by actinic irradiation, which is most effective at those regions of the electromagnetic spectrum at which there is high absorption of electromagnetic energy by the particular catalyst precursor used. More than one of these types of energy may be applied to the same system; e.g., ultraviolet light irradiation followed by electron beam irradiation, and post-heating also may be employed, although irradiation ordinarily can effect a suitable cure.

Preferred photosensitive Lewis acid catalyst precursors are aromatic diazonium salts of complex halogenides, which decompose upon application of energy to release a halide Lewis acid. The aromatic diazonium cation may be represented generally as [Ar-N$^+$≡N], where the aryl group Ar, which may be alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus the pendant substituent may be alkyl, or another substituent, or both. The complex halogenide anion may be represented by [MX$_{n+m}$]$^{-m}$. Thus, the photosensitive salt and its decomposition upon actinic irradiation may be depicted as follows:

[Ar-N$^+$≡N]$_m$ [MX$_{n+m}$]$^{-m}$ $\xrightarrow{h\nu}$ mAr-X + mN$_2$ + MX$_n$,    (1)

where X is the halogen ligand of the complex halogenide, M is the metallic or metalloid central atom thereof, m is the net charge on the complex halogenide ion, and n is the number of halogen atoms in the halide Lewis acid compound released. The Lewis acid halide MX$_n$ is an electron pair acceptor, such as FeCl$_3$, SnCl$_4$, PF$_5$, AsF$_5$, SbF$_5$, and BiCl$_3$, which upon suitable irradiation of the diazonium complex salt is released in substantial quantities and initiates or catalyzes the polymerization process, wherein the monomeric or prepolymeric material is polymerized or cured as the result of the actinic irradiation.

The catalyst precursors in the form of photosensitive aromatic diazonium salts of complex halogenides may be prepared using procedures known in the art. Thus, for example, chlorometallic halogenide complexes may be prepared in accordance with the method set forth by Lee et al. in *Journal of the American Chemical Society*, 83, 1928 (1961). Exemplifying a procedure of general utility, arenediazonium hexafluorophosphates can be prepared by diazotizing the corresponding aniline with NOPF$_6$, made by combining HCl and NaNO$_2$ with subsequent addition of hydrogen hexafluorophosphate (HPF$_6$) or of a hexafluorophosphate salt, or they can be prepared by addition of a hexafluorophosphate salt to another diazonium salt to effect precipitation. As a further example, various morpholinoaryl complexes, containing the group

can be prepared either from the aniline derivative or by adding an aqueous solution of a metal salt of the desired complex halogenide to a solution of morpholinobenzenediazonium tetrafluoroborate.

An illustrative selection of aromatic diazonium salts of complex halogenides is listed in Table I. Many of the salts listed have been found to be well adapted or superior for use as latent photosensitive polymerization initiators in the epoxide polymerization process and polymerizable epoxidic compositions of the present invention, based on thermal stability, on solubility and stability in the epoxy formulations used, on photosensitivity, and on ability to effect polymerization with the desired degree of curing after adequate actinic irradiation. Following the name of each aromatic diazonium halogenide is its melting point or decomposition temperature, in degrees centigrade, and wavelengths of electromagnetic radiation, in nanometers, at which it exhibits absorption maxima.

The melting points given in Table I were determined generally by the usual visual capillary tube method; in most cases discoloration began below the observed melting point temperature with frothing decomposition at that temperature. In some cases melting points or exotherms were determined also by differential thermal analysis under nitrogen gas, and the temperatures so determined are given in parentheses. The wavelengths of absorption maxima in the ultraviolet-to-visible range were determined with the diazonium complex salt dissolved in acetonitrile.

TABLE I

|  | M.P., °C. | Abs'n Max., nm. |
|---|---|---|
| 2,4-dichlorobenzenediazonium tetrachloroferrate(III) | 62–64 | 259, 285, 360 |
| p-nitrobenzenediazonium tetrachloroferrate(III) | 93–95 | 243, 257, 310, 360 |
| p-morpholinobenzenediazonium tetrachloroferrate(III) | 121.5 | 240, 267, 313, 364 |
| 2,4-dichlorobenzenediazonium hexachlorostannate(IV) | 190 | 285 |
| p-nitrobenzenediazonium hexachlorostannate(IV) | 126 | 258, 310 |
| 2,4-dichlorobenzenediazonium tetrafluoroborate | 152 | 285, 325–340 (shoulder) |
| p-chlorobenzenediazonium hexafluorophosphate | 162–164 | 273 |
| 2,5-dichlorobenzenediazonium hexafluorophosphate | dec. 140 | 264, 318 |
| 2,4,6-trichlorobenzenediazonium hexafluorophosphate | 240–250 | 294, 337 |
| 2,4,6-tribromobenzenediazonium hexafluorophosphate | 245–260 | 306 |
| p-nitrobenzenediazonium hexafluorophosphate | 156 (178) | 258, 310 |
| o-nitrobenzenediazonium hexafluorophosphate | 161.5 |  |
| 4-nitro-o-toluenediazonium hexafluorophosphate (2-methyl-4-nitro-benzenediazonium hexafluorophosphate) | (138) | 262, 319 |
| 2-nitro-p-toluenediazonium hexafluorophosphate (4-methyl-2-nitro-benzenediazonium hexafluorophosphate) | 164–165 | 286 |
| 6-nitro-2,4-xylenediazonium hexafluorophosphate (2,4-dimethyl- | 150 | 237, 290 |

TABLE I-continued

| | M.P., °C. | Abs'n Max., nm. |
|---|---|---|
| 6-nitrobenzenediazonium hexafluorophosphate | | |
| p-morpholinobenzenediazonium hexafluorophosphate | 162 (181) | 377 |
| 4-chloro-2,5-dimethoxybenzenediazonium hexafluorophosphate | 168–169 (198–208) | 243 (shoulder), 287, 392 |
| 2,5-dimethoxy-4-morpholinobenzenediazonium hexafluorophosphate | Above 135 | 266, 396 |
| 2-chloro-4-(dimethylamino)-5-methoxybenzenediazonium hexafluorophosphate | 111 | 273, 405 |
| 2,5-diethoxy-4-(p-tolylthio)benzenediazonium hexafluorophosphate (2,5-diethoxy-4-(p-tolylmercapto)-benzenediazonium hexafluorophosphate) | 147 (150) | 223 (shoulder), 247, 357, 397 |
| 2,5-dimethoxy-4-(p-tolylthio)benzenediazonium hexafluorophosphate | 146 (155) | 358, 400 |
| 2,5-dimethoxy-4'-methyl-4-biphenyldiazonium hexafluorophosphate (2,5-dimethoxy-4-(p-tolyl)benzenediazonium hexafluorophosphate) | 167 | 405 |
| 2,4',5-triethoxy-4-biphenyldiazonium hexafluorophosphate (2,5-diethoxy-4-(p-ethoxyphenyl)benzenediazonium hexafluorophosphate) | 136 | 265, 415 |
| 4-(dimethylamino)-1-naphthalenediazonium hexafluorophosphate | 148 | 280, 310, 410 |
| p-nitrobenzenediazonium hexafluoroarsenate(V) | 141–144 (161) | 257, 310 |
| p-morpholinobenzenediazonium hexafluoroarsenate(V) | 162 (176–177) | 257, 378 |
| 2,5-dichlorobenzenediazonium hexafluoroantimonate(V) | 161–162.5 | 238, 358 |
| p-nitrobenzenediazonium hexafluoroantimonate(V) | 140–141 | 257, 308 |
| p-morpholinobenzenediazonium hexafluoroantimonate(V) | 153 (177.5–180.5) | 254, 374 |
| 2,4-dichlorobenzenediazonium hexachloroantimonate(V) | 178–180 | 279, 322 (shoulder) |
| 2,4-dichlorobenzenediazonium pentachlorobismuthate(III) | 193.5–195 | 285, 313 |
| o-nitrobenzenediazonium pentachlorobismuthate(III) | 166.5–168 | 285, 313 |

The cationic initiators or catalyst precursors listed hereinabove are solids. It usually is possible to dissolve such ingredients in one or more of the polymerizable ingredients making up the epoxide blend which is utilized in the polymerizable compositions of the present invention. However, it frequently is more convenient for mixing purposes to provide such an ingredient for the mixing operation already dissolved in a solvent. Thus the use of a small amount of a solvent medium such as acetone or anisole often is convenient for introducing the solid additive and facilitating its solution and distribution throughout the epoxide blend. It has been found that commercial propylene carbonate (a cyclic propylene ester of carbonic acid, probably identified as primarily 4-methyl-1,3-dioxolan-2-one) makes a good solvent for the aromatic diazonium complex salts, and the propylene carbonate so used is completely miscible with epoxy resins. For example, propylene carbonate may make up between approximately 1% and 2-½% by weight of the entire polymerizable composition.

To avoid substantially the disadvantages of utilizing an inert solvent medium, the total amounts of any solvents which do not participate in the polymerization reactions, including a solvent such as propylene carbonate and any volatile solvents present, should be kept below about 4% by weight. In particular, unpolymerizable volatile solvents boiling below about 190°C should be kept within this approximate limit of 4% by weight to avoid the substantial evolution of waste gases during application and polymerization of the polymerizable composition. Within this approximate limit, the presence of solvents is not found to change the essential character of the epoxide blends and polymerizable compositions of the present invention.

Referring to equation I hereinabove showing the photolytic decomposition of a catalyst precursor, the halide Lewis acid $MX_n$ released reacts with the epoxidic materials of the blend with a result exemplified by the following:

$$ArN_2M(X_{n+1}) + monomer \xrightarrow{radiation} polymer. \qquad (II).$$

The cationic catalyst is believed to act by cleaving a carbon-oxygen epoxy bond, initiating growth of a polymeric chain or permitting formation of a cross-linkage. A general application of the process embodied by equations I and II can be as follows: a diazonium complex salt, for example, as identified hereinabove, is admixed with the epoxide blend. The mixture is thereafter coated on a suitable substrate such as a metal plate, plastic, or paper, and the substrate is exposed to ultraviolet or electron beam radiation. On exposure the diazonium compound decomposes to yield the Lewis acid catalyst, which initiates the polymerization of the epoxy monomer. The resulting polymer is resistant to most solvents and chemicals.

The source of radiation for effecting production of the epoxidic polymer can be any suitable source, such as the ultraviolet actinic radiation produced from a mercury, xenon, or carbon arc lamp, or the electron beam produced in a suitably evacuated cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

For an imaging system, the mixture of epoxides and cationic initiator is coated on a metal plate, and the plate is exposed to ultraviolet light through a mask or negative. The light initiates polymerization which propagates rapidly in the exposed image areas. The resulting polymer in the exposed areas is resistant to many or most solvents and chemicals, while the unexposed areas can be washed away with suitable solvents to leave a reversal image of an epoxy polymer in this embodiment.

The polymers produced by the polymerizing process of the present invention are useful in a wide variety of applications in the field of coating, decoration of substrates, and graphic arts, due to their superior adhesion to metal and paper surfaces, excellent resistance to most solvents and chemicals, and capability of forming high resolution images. Among such uses are photoresists for chemical milling, gravure images, offset plates, stencil-making, microimages for printed circuitry, thermoset vesicular images, microimages for information storage, decoration of paper, glass, and packages, and light-cured coatings.

The procedures for mixing the epoxide blends and curable compositions of the present invention are relatively simple. The several monomer and prepolymer resins are combined with each other and with the catalyst precursor, serially or in one mixing operation, in suitable blending or mixing apparatus, such as a conventional propeller stirrer. The catalyst precursor thus may be dissolved directly in the premixed epoxide blend, or in an epoxide component thereof having good solvent properties and low viscosity which thereafter is blended with the other epoxides to form the blend. Alternatively, the cationic initiator may be mixed preliminarily in a small proportion of a volatile or nonvolatile solvent medium, as discussed hereinabove, and then combined with the polymerizable material.

The amount of catalyst precursor employed should be sufficient to insure complete polymerization. It has been found that quite satisfactory results are obtained by providing a diazonium complex salt, for example, in amount by weight from about 0.5% to about 5% of the catalyst precursor relative to the weight of the polymerizable epoxide material present, about 1% or less of the precursor being amply effective with most epoxide-catalyst precursor systems. To be satisfactorily effective, the cationic initiator present in the polymerizable composition should be soluble in the epoxy resin blend, should not react with the epoxides at room temperature in the absence of activating radiation, but should decompose rapidly on exposure to actinic radiation or electron beams of sufficient energy, to liberate a cationic agent for initiating polymerization of the epoxide materials.

It may be desirable to include in the epoxide blend, or in the polymerizable composition made up with the epoxide blend, an inert pigment or filler, which may be present in even a major proportion by weight, or small amounts of inert non-volatile liquids such as mineral oil, softeners, surfactants, or like adjuvants. Inclusion of such substantially inert ingredients usually makes advisable a proportionate increase in the optimum amount of catalyst precursor used. Nevertheless, the precursor needed rarely exceeds 5% of the entire weight of the composition. It will be appreciated that the presence of such additional inert ingredients does not substantially affect or alter the essential characteristics of the epoxide blend or of the polymerizable compositions as regards their intended utilizations or essential properties.

The following examples will serve further to illustrate the present invention.

EXAMPLE 1

A blend was prepared of the following epoxide materials, in parts by weight:

| | |
|---|---|
| 1,4-Butanediol diglycidyl ether | 1,000 (50.0%) |
| (3,4-Epoxycyclohexyl)methyl 3,4-epoxycyclohexanecarboxylate | 1,000 (50.0%) |

An amount equal to 12 parts by weight of a catalyst precursor, 2,5-diethoxy-4-(p-tolylthio)benzenediazonium hexafluorophosphate, was dissolved in the resin blend, constituting 0.60% of the weight of the resulting polymerizable composition.

A small quantity of this light-sensitive composition was spread by hand draw-down in a thin film over an aluminum plate and exposed to a 360-watt high pressure mercury arc lamp at a distance of 2 inches. Polymerization commenced immediately upon exposure to the ultraviolet radiation, and within 40 seconds the coating on the aluminum plate had cured to a hard finish. This formulation including a polyglycidyl ether of a polyhydric alcohol is well suited for application to metal substrates using conventional production roller coaters. Printed or decorative matter may be provided by applying portions of such a mixture containing appropriate pigments to predetermined areas of the surface of the metal substrate, or the entire surface may be coated therewith, followed by the application of energy through irradiation to cure the composition transferred to the substrate and produce the desired coated or imprinted metal product.

EXAMPLE 2

An epoxide blend was prepared, using 20 milliliters of each of the following materials to provide a mixture containing closely equal parts by weight of the two materials:

| | |
|---|---|
| 1,4-Butanediol diglycidyl ether | (50% approx.) |
| (3,4-Epoxycyclohexyl)methyl 3,4-epoxycyclohexanecarboxylate | (50% approx.) |

A solution was made by dissolving 7.5 grams of the latent initiator p-chlorobenzenediazonium hexafluorophosphate in 50 milliliters of acetonitrile. A 1 ml portion of this solution, containing 0.15 g of the initiator complex salt, was mixed into the blend obtained by mixing the above-specified volumes of epoxides, thus providing the initiator therein in amount equal to approximately 0.33% of the total weight, and also providing therein the acetonitrile solvent in amount equal to approximately 1.55% of the total weight. The beneficial effect of such small addition of acetonitrile in inhibiting premature gelation of the polymerizable epoxide composition is disclosed and claimed in my application Ser. No. 144,667 now U.S. Pat. No. 3,721,616 issued Mar. 20, 1973, filed concurrently herewith and assigned to the same assignee as that of the present application.

A portion of the composition prepared as above was applied to metal and plastic substrates in the form of an aluminum sheet and a sheet of polyethylene plastic material, using a drawbar (No. 3) to obtain even coatings of the order of 0.0005 inch thick when wet. The coated sheets were exposed to the radiation from a 360-watt mercury arc lamp at a distance of 3 inches for 1 minute, giving hard cured coatings on both metal and plastic substrates.

EXAMPLE 3

The following epoxides were blended:

| | |
|---|---|
| Vinylcyclohexene dioxide | 22 g (52.4%) |
| (3,4-Epoxycyclohexyl)methyl 3,4-epoxycyclohexanecarboxylate | 20 g (47.6%) |

Another 1-milliliter portion of the same solution of latent initiator, prepared as described in Example 2, was added to the blend of vinylcyclohexene dioxide with the bis(epoxycyclohexyl) ester. This addition provided 0.35% by weight of initiator and approximately 1.6% by weight of acetonitrile in the resulting polymerizable composition. Portions of this composition likewise were coated on metal and plastic substrates and irradiated under the mercury arc for 1 minute, again giving hard cured coatings on both the metal and plastic surfaces.

EXAMPLE 4

An epoxide blend was made up of the following epoxides in parts by weight:

| | |
|---|---|
| Vinylcyclohexene dioxide | 2 parts (28.6%) |
| (3,4-Epoxycyclohexyl)methyl 3,4-epoxycyclohexanecarboxylate | 5 parts (71.4%) |

To 10 g of this blend there were added 60 mg (0.60% of the total weight) of 2,5-diethoxy-4-(p-tolylthio)benzenediazonium hexafluorophosphate, and stirring was continued until dissolved. The resulting light-sensitive formulation was used to coat a plate of chromated steel, using a No. 3 drawbar. The steel plate was exposed to a 360-watt mercury arc at a distance of 2 inches for 2 seconds, then placed in an oven at 110°C for 10 minutes. The coating cured to a hard, glossy protective finish. To test adhesion the coated plate was immersed for 30 minutes in a hot water bath maintained at 70°C, removed, blotted dry, scratched with a sharp blade and impressed with a piece of highly adhesive plastic tape. Pulling the tape off sharply failed to remove the coating from the metal plate.

EXAMPLE 5

The bis(epoxycyclohexyl) ester may provide a very high proportion of the epoxide materials, as illustrated by the following blend:

| | |
|---|---|
| Prepolymer consisting substantially of diglycidyl ether of bisphenol A | 40 g (10%) |
| (3,4-Epoxycyclohexyl)methyl 3,4-epoxycyclohexanecarboxylate | 360 g (90%) |

The prepolymer product used was specified to have a viscosity at 25°C in the range of 6,500–9,500 cps and an epoxy equivalent weight of 180–188. To this weight of the blend was added a solution of 4 g (0.97% of the total weight) of p-chlorobenzenediazonium hexafluorophosphate in 8 ml (9.65 g, or 2.33%) of propylene carbonate. The resulting mixture was placed in the fountain of a Heidelberg printing press of the dry offset type and applied to paper as a thin coating. The paper was then placed on a conveyor passing beneath two 1200-watt high-pressure mercury arcs. Shortly after exposure to the mercury arcs, the coating had cured to a hard, glossy finish.

Examples 6 and 7 illustrate epoxide blends near the upper limit of the proportion of the prepolymer material.

EXAMPLE 6

The following epoxide blend was prepared, in parts by weight:

| | | |
|---|---|---|
| Prepolymer consisting substantially of diglycidly ether of bisphenol A | 720 parts | |
| Epoxy phenol novolak | 90 parts | |
| | 810 parts | (81.8%) |
| (3,4-Epoxycyclohexyl)methyl 3,4-epoxycyclohexanecarboxylate | 180 parts | (18.2%) |

The diglycidyl ether of bisphenol A was specified to have a viscosity of 6,500-9,500 cps at 25°C and an epoxy equivalent weight of 180-188; the epoxidized phenol novolak had a viscosity at 52°C in the range of 1,400–2,000 cps and an epoxy equivalent weight of 172-179. Also included in this epoxide blend as a surface active adjuvant were 9 parts of mineral oil (making 999 parts by weight, and becoming 0.87% of the total weight of the polymerizable composition). The polymerizable composition was completed by adding, to a 400-gram portion of the above composition including mineral oil, 4 g (0.97% of the total weight) of p-chlorobenzenediazonium hexafluorophosphate in 8 ml (9.65 g, or 2.33% of the total weight) of propylene carbonate. The epoxide blend of diglycidyl ether of bisphenol A and novolak constituted 95.8% of the total weight, or 96.8% including the benzediazonium complex salt as the cationic initiator.

The clear varnish thus prepared was applied to paper as a coating by a dry offset printing press. The coated paper was placed on a conveyor moving at 500 feet per minute and passing beneath two 1200-watt high pressure mercury arcs. Immediately after exposure the varnish already was dry to the touch and gave a hard glossy finish over the paper.

EXAMPLE 7

A blend of epoxy resins was prepared by mixing the following, in parts by weight:

| | | |
|---|---|---|
| Prepolymer consisting substantially of diglycidyl ether of bisphenol A | 600 parts | |
| Epoxy phenol novolak | 78 parts | |
| | 678 parts | (85.5%) |
| (3,4-Epoxycyclohexyl)methyl 3,4-epoxycyclohexanecarboxylate | 115 parts | (14.5%) |

The above epoxides were the same products used in the epoxide blend of Example 6. To a fraction of this resin blend was added 1% by weight (7.93 parts, or 0.96% of the total weight) of p-chlorobenzenediazonium hexafluorophosphate dissolved in an amount of methyl ethyl ketone equal to 3% by weight of the fraction of resin blend (23.8 parts, or 2.88% of the total weight). This light-sensitive formulation then was applied to paper in a thin film and exposed to a 1200-watt high pressure mercury arc lamp for 0.5 second at a distance of 2 inches. The resin film cured to a hard, non-tacky finish.

EXAMPLE 8

The following resin blend was prepared, in parts by weight:

| | |
|---|---|
| Epoxy phenol novolak | 100 (33.3%) |
| (3,4-Epoxycyclohexyl)methyl 3,4-epoxycyclohexanecarboxylate | 200 (66.7%) |

The novolak had a viscosity in the range of 1,400–2,000 cps at 32°C and an epoxy equivalent weight of 172–179. Along with these epoxides there also were included 2.3 parts (0.76% of the total weight) of the catalyst precursor 2,5-diethoxy-4-(p-tolylthio)-benzenediazonium hexafluorophosphate and mixing was continued until a homogeneous solution was obtained.

A roller coater was used to apply portions of this solution to a clay-filled paper substrate and also to another paper substrate already carrying a printed ink decoration. The coated papers were passed beneath a 360-watt high pressure mercury lamp for 10 seconds at a distance of 3 inches. The coatings cured to an odorless finish having high gloss.

On stacking the coated sheets produced as described in Example 8, a slight tendency was observed for the sheets to adhere to each other. This tendency was overcome by a rather small modification of the epoxide blend, in which was included a monoepoxide, in the form of 1,2-epoxybutane, having a viscosity at 23°C of less than 20 cps. This modified formulation is described in Example 9, and the examples following Example 9 illustrate a variety of formulations in which the epoxide blend includes such a monoepoxide in addition to the prepolymer material and the bis(epoxycycloalkyl) ester.

EXAMPLE 9

A modified resin blend, based on the formulation of Example 8, was mixed to include the following epoxides, in parts by weight:

| | |
|---|---|
| Epoxy phenol novolak | 100 parts (32.9%) |
| (3,4-Epoxycyclohexyl)methyl 3,4-epoxycyclohexanecarboxylate | 200 parts (65.8%) |
| 1,2-Epoxybutane | 4 parts ( 1.3%) |

As with Example 8, 2.3 parts (0.75% of the total weight) of 2,5-diethoxy-4-(p-tolylthio)benzenediazonium hexafluorophosphate were mixed thoroughly in with the epoxide blend. When portions of the resulting formulation were coated on paper and cured as in Example 8, the coated paper sheets showed no tendency to adhere when stacked.

EXAMPLE 10

The following epoxides were blended (parts by weight):

| | |
|---|---|
| Epoxy phenol novolak | 16 parts (59.3%) |
| (3,4-Epoxycyclohexyl)methyl 3,4-epoxycyclohexanecarboxylate | 8 parts (29.6%) |
| 1,2-Epoxybutane | 3 parts (11.1%) |

The novolak had a viscosity in the range of 1,400–2,000 cps at 52°C and an epoxy equivalent weight of 172–179. To 10 g of the above resin blend there was thoroughly admixed 0.1 g (0.99% of the total weight) of 2,5-diethoxy-4-(p-tolylthio)benzenediazonium hexafluorophosphate. The resulting light-sensitive coating formulation was applied to paperboard, using a roller coater, and exposed to a 360-watt high-pressure mercury arc. Within 25 seconds the coating had cured to a hard finish showing a high gloss and good adhesion to the paperboard.

EXAMPLE 11

Another blend of epoxides was made of the following, in parts by weight:

| | |
|---|---|
| Epoxy phenol novolak | 160 parts (59.3%) |
| (3,4-Epoxycyclohexyl)methyl 3,4-epoxycyclohexanecarboxylate | 80 parts (29.6%) |
| Alkyl glycidyl ether in which alkyl groups are predominantly octyl and decyl | 30 parts (11.1%) |

The novolak product of Example 10 was used also in the above blend. To 200 parts by weight of this resin blend was added 2.1 parts by weight (1.01%) of 2,5-diethoxy-4-(p-tolylthio)benzenediazonium hexafluorophosphate dissolved in 5 parts (2.41%) of acetonitrile. This light-sensitive coating formulation was applied to paperboard using a roller coater. The coated board was exposed to a 360-watt high pressure mercury arc, for 5 seconds, which caused the coating to cure to a hard, glossy finish.

EXAMPLE 12

An epoxide blend was mixed as follows (parts by weight):

| | |
|---|---|
| Epoxy phenol novolak | 10 parts (71.5%) |
| (3,4-Epoxycyclohexyl)methyl 3,4-epoxycyclohexanecarboxylate | 3 parts (21.4%) |
| 1,2-Epoxybutane | 1 part ( 7.1%) |

Again a novolak was used having a viscosity in the range of 1,400–2,000 cps and an epoxy equivalent weight of 172–179. In a 20 ml portion of the above blend there was dissolved 0.5 g of 2,5-diethoxy-4-(p-tolylthio)benzenediazonium hexafluorophosphate, which made up approximately 1.4% of the total weight of the resulting photosensitive composition. The resulting solution was applied to the surface of a coating-holdout paper, clay-filled to prevent rapid penetration, and to another paper substrate whose surface was covered with a printed ink decoration. These coated papers were exposed to a 360-watt high pressure mercury lamp at a distance of 3 inches for 10 seconds. The coatings cured to a hard, glossy, practically odorless finish.

EXAMPLE 13

As exemplifying a polymerizable composition curable by application of thermal energy alone, that is, by heating the composition as coated or otherwise applied, a resin blend was prepared by mixing the following epoxide materials (in parts by weight):

| Prepolymer consisting substantially of diglycidyl ether of bisphenol A | 20 parts (60.6%) |
|---|---|
| (3,4-Epoxycyclohexyl)methyl 3,4-epoxycyclohexanecarboxylate | 10 parts (30.3%) |
| Alkyl glycidyl ether in which alkyl groups are predominantly dodecyl and tetradecyl | 3 parts ( 9.1%) |

The bisphenol A diglycidyl ether prepolymer used had a viscosity at 25°C in the range of 4,000–6,000 cps and an epoxy equivalent weight of 172-178. To 100 g of this resin blend there was added 2 g (1.96%) of boron trifluoride monoethylamine complex, and the mixture was stirred with gentle warming until a homogeneous solution was formed.

Aliquots of 5 ml each were withdrawn from this solution and immersed in an oil bath at various temperatures. The time required for the formulation to harden was noted, with the following results:

| Bath Temperature, °C | Time to Harden, Seconds |
|---|---|
| 160 | More than 120 |
| 170 | 80 |
| 180 | 65 |
| 190 | 65 |

A few drops of the catalyzed formulation were placed on a steel sheet and drawn down to a thin film with a glass rod. The steel sheet was placed on a hot plate. Within 5 seconds the film had hardened, providing a glossy, protective coating which showed good adhesion to the steel sheet.

EXAMPLE 14

An epoxide blend was made as follows:

| Epoxide | Viscosity at 25°C, Cps | Epoxy Equiv. Wt. | Parts by Weight |
|---|---|---|---|
| Prepolymer consisting substantially of diglycidyl ether of bisphenol A | 6500–9500 | 182 | 18 (51.4%) |
| (3,4-Epoxycyclohexyl)methyl 3,4-epoxycyclohexanecarboxylate | 275 | 139 | 12 (34.3%) |
| Alkyl glycidyl ether in which alkyl groups are predominantly dodecyl and tetradecyl | 8 | 263 | 5 (14.3%) |

A 400 g aliquot of this blend was measured out, and to it were added 10 ml of a 1.0 molar solution of a light-sensitive cationic initiator, namely p-chlorobenzenediazonium hexafluorophosphate, in acetone. This addition provided approximately 0.7% of the latent initiator and approximately 1.6% of the volatile solvent, expressed in percentages of the total weight. A coating of this formulation may be cured readily by exposure to radiation from a mercury arc.

EXAMPLE 15

A blend of epoxide resins were prepared by mixing the following materials, in parts by weight:

| Prepolymer consisting substantially of diglycidyl ether of bisphenol A | 4 parts (57.1%) |
|---|---|
| (3,4-Epoxycyclohexyl)methyl 3,4-epoxycyclohexanecarboxylate | 2 parts (28.6%) |
| Alkyl glycidyl ether in which alkyl groups are predominantly octyl and decyl | 1 part (14.3%) |

The diglycidyl ether of bisphenol A has an epoxy equivalent weight of approximately 187 and a viscosity at 25°C specified to be within the range of 5,000 to 6,400 cps. To an amount of this epoxide blend weighing 350 g there were added 2.8 g (0.79%) of a latent cationic polymerization initiator in the form of p-nitrobenzenediazonium tetrafluoroborate. The viscosity of the resulting composition upon mixing was 410 cps at 25°C. Polymerization of coatings of this composition is initiated by irradiation with ultraviolet light.

EXAMPLE 16

The following resin blend was mixed:

| Vinylcyclohexene dioxide | 10 parts (43.5%) |
|---|---|
| (3,4-Epoxycyclohexyl)methyl 3,4-epoxycyclohexanecarboxylate | 10 parts (43.5%) |
| 1,2-Epoxybutane | 3 parts (13.0%) |

In 10 g of this blend there was dissolved 60 mg (0.60%) of 2,5-diethoxy-4-(p-tolylthio)benzenediazonium hexafluorophosphate. The resulting light-sensitive solution was spread in a thin film over the surface of a chromated steel plate, exposed to a 360-watt mercury arc for 2 seconds, and then heated in an oven at 110°C for 10 minutes. The coating at the end of this time was hard and displayed excellent adhesion to the metal plate.

EXAMPLE 17

Another resin blend was made, as follows:

| Vinylcyclohexene dioxide | 16 parts (41.0%) |
|---|---|
| (3,4-Epoxycyclohexyl)methyl 3,4-epoxycyclohexanecarboxylate | 20 parts (51.3%) |
| Alkyl glycidyl ether in which alkyl groups are predominantly octyl and decyl | 3 parts ( 7.7%) |

A 60-mg weight of 2,5-diethoxy-4-(p-tolylthio)-benzenediazonium hexafluorophosphate was dissolved in a 10-gram weight drawn from this resin blend. Thin films of the resulting light-sensitive coating formulation were applied to sheets of aluminum and of chromated steel. After a 2-second exposure to a 360-watt high pressure mercury arc, the coated metal sheets were baked for 10 minutes at 110°C. The coating cured to a hard, tough finish showing good adhesion to the aluminum and chromated steel substrates.

EXAMPLE 18

The following blend including two epoxidic prepolymers was prepared:

| | | |
|---|---|---|
| Prepolymer consisting substantially of diglycidyl ether of Bisphenol A | 6 g | |
| Epoxy phenol novolak | 6 g | |
| | 12 g | (21.4%) |
| (3,4-Epoxycyclohexyl)methyl 3,4-epoxycyclohexanecarboxylate | 40 g | (71.5%) |
| Allyl glycidyl ether | 4 g | (7.1%) |

The diglycidyl ether of bisphenol A was specified to have a viscosity of 5,000–6,500 cps at 25°C and a minimum epoxy equivalent weight of 178; the novolak product was specified to have a viscosity of 1,400–2,000 cps at 52°C and an epoxy equivalent weight between 172 and 179. When the epoxide blend described above was prepared, the mixture included also 392 mg of p-chlorobenzenediazonium hexafluorophosphate, equal to 0.70% of the weight of the mixture. The resulting light-sensitive formulation was applied to paperboard using a roller coater, and the coated paperboard was exposed to two 1200-watt mercury arcs while on a conveyor moving at 480 feet per minute. The coating cured to a hard, glossy finish.

EXAMPLE 19

A large batch of epoxide materials was prepared by blending the following, in the indicated proportions by weight:

| | | |
|---|---|---|
| Epoxy phenol novolak | 250 parts | |
| Vinylcyclohexene dioxide | 25 parts | |
| | 275 parts | (68.75%) |
| Bis[(3,4-epoxy-6-methylcyclohexyl)methyl]adipate | 75 parts | (18.75%) |
| Alkyl glycidyl ether in which alkyl groups are predominantly octyl and decyl | 50 parts | (12.50%) |
| | 400 parts | |

The novolak used in this blend had a viscosity at 52°C within the range of 1,400–2,000 cps and an epoxy equivalent weight of 172–179. The four epoxide materials, blended in the given proportions, had a viscosity of about 400 cps at 23°C. To 400 parts of this epoxide blend were added 20 parts of a 20% solution of p-chlorobenzenediazonium hexafluorophosphate in acetonitrile, providing therein 4 parts of the catalyst precursor, or 0.95% by weight of the entire polymerizable composition. The remaining 16 parts of acetonitrile, a volatile solvent with gelation-inhibiting properties, constituted 3.81% of the weight of the composition.

The catalyzed formulation was applied to a coating-holdout paper, using a roller coater. The coated paper then was exposed to a 360-watt high pressure mercury lamp at a distance of 3 inches for 5 seconds. The coating was found to have cured to a non-tacky, high gloss finish and showed good adhesion to the paper.

EXAMPLE 20

In another 100 parts by weight of the batch of resin blend described in Example 19 there were dissolved 1.2 parts of 2,5-diethoxy-4-(p-tolylthio)benzenediazonium hexafluorophosphate (1.19% of the total weight).

The solution then was used to coat sheets of a clay-coated paperboard, using a roller coater. The resin-coated sheets were placed on a conveyor belt moving at 500 feet per minute and passed beneath a 1200-watt high pressure mercury lamp 17 inches in length at a distance of 3 inches. The coating cured to a non-tacky finish. To test for "blocking", the coated sheets were stacked and pressed in a hydraulic press under 10 tons of pressure for 10 minutes. There was no evidence of sticking together. The stacked sheets then were kept under a pressure of 50 pounds for 72 hours. There was no tendency for the sheets so pressed to stick together.

EXAMPLE 21

Another portion of a light-sensitive composition was made by dissolving 1 part by weight of the 2,5-diethoxy-4-(p-tolylthio)benzenediazonium hexafluorophosphate catalyst precursor in another 100 parts of the epoxide batch of Example 19, giving 0.99% by weight of the catalyst precursor.

The resulting solution was used to coat a special paper filled with a polybutadiene latex. After coating, the paper immediately was exposed to a 360-watt high pressure mercury lamp at a distance of 3 inches for 5 seconds. The coating cured to a high-gloss, non-tacky finish free of odor.

The same solution was used to coat continuously at a rate of 100 feet per minute a reel of paper 8 inches wide, using a laboratory roller coating machine. The coated web then was passed beneath a 1200-watt mercury lamp 17 inches long at a distance of 3 inches and immediately rewound. The cured finish was glossy, nearly odorless, and showed no tendency to stick on rewinding.

EXAMPLE 22

A mixture was prepared of the following epoxide materials in the indicated proportions:

| | | |
|---|---|---|
| Epoxy phenol novolak | 12.50 g | |
| Vinylcyclohexene dioxide | 1.25 g | |
| | 13.75 g | (68.75%) |
| (3,4-Epoxycyclohexyl)methyl 3,4-epoxycyclohexanecarboxylate | 3.75 g | (18.75%) |
| Glycidyl phenyl ether | 2.50 g | (12.50%) |
| | 20.00 g | |

The novolak used had the same specifications as that used in the composition of Example 19. To 20 g of the above mixture there was added 0.2 g (0.99%) of 2,5-diethoxy-4-(p-tolylthio)benzenediazonium hexafluorophosphate. The resulting light-sensitive coating formulation was applied to paperboard, using a roller coater, and immediately exposed to a 360-watt high pressure mercury arc for 5 seconds. The coating, liquid before exposure, was hard and glossy immediately after exposure.

EXAMPLE 23

The following blend of epoxy resins was prepared:

| | | |
|---|---|---|
| Prepolymer consisting substantially of diglycidyl ether of bisphenol A | 30 parts | |
| 1,4-Butanediol diglycidyl ether | 3 parts | |
| | 33 parts | (66.0%) |
| (3,4-Epoxycyclohexyl)methyl 3,4-epoxycyclohexanecarboxylate | 15 parts | (30.0%) |
| Alkyl glycidyl ether in which alkyl groups are predominantly dodecyl and tetradecyl | 2 parts | (4.0%) |

The diglycidyl ether of bisphenol A used in this blend had a viscosity at 25°C in the range of 4,000–6,000 cps and an epoxy equivalent weight of 172–178. To 40 g of this resin blend were added 0.4g (0.99%) of 2,5-diethoxy-4-(p-tolylthio)benzenediazonium hexafluorophosphate. The resulting solution was used to coat paper. The coated paper was placed on a conveyor moving at 270 feet per minute and passed beneath two 1200-watt mercury arcs, each 18 inches long. After exposure, the coating had cured to a hard, glossy finish.

EXAMPLE 24

Eight different light-sensitive coating compositions were prepared, each consisting of the following ingredients in the indicated proportions by weight:

| | | |
|---|---|---|
| Prepolymer consisting substantially of diglycidyl ether of bisphenol A | 30 parts | |
| 1,4-Butanediol diglycidyl ether | 3 parts | |
| | 33 parts | (66.0%) |
| (3,4-Epoxycyclohexyl)methyl 3,4-epoxycyclohexanecarboxylate | 15 parts | (30.0%) |
| Monoepoxide (specified below) | 2 parts | (4.0%) |
| | 50 parts | (100.0%) |
| 2,5-Diethoxy-4-(p-tolylthio)-benzenediazonium hexafluorophosphate | 0.5 parts (0.99% of the total weight) | |

Each composition was mixed until the diazonium complex salt was distributed and dissolved therein. The bisphenol A diglycidyl ether product was the same product as used in the composition of Example 23.

The monoepoxides used individually in the eight compositions, each monoepoxide product having a viscosity at 23°C of less than 20 cps, were the following:

A-1,2-Epoxybutane
B-Cyclopentene oxide (6-oxabicyclo[3.1.0]hexane)
C-Cyclohexene oxide (7-oxabicyclo[4.1.0]heptane)
D-Butyl glycidyl ether
E-Phenyl glycidyl ether
F-Tetrahydrofuran, $\underset{\hspace{1em}}{CH_2CH_2CH_2CH_2-O}$ G-Mixture of 1-alkenes having predominantly 11 to 14 carbon atoms
H-Mixture of 1-alkenes having predominantly 15 to 18 carbon atoms A portion of each of these eight compositions was spread in a thin film over paper, then placed on a conveyor moving at a speed of 380 feet per minute beneath two 1200-watt mercury arc lamps at a distance of 2 inches from the coated surfaces of the paper. During passage under the mercury arcs all of the coatings cured to a hard, glossy finish.

EXAMPLE 25

The following materials were mixed in the indicated proportions by weight:

| | | |
|---|---|---|
| Prepolymer consisting substantially of diglycidyl ether of bisphenol A (as used in Example 23) | 20 parts | (60.6%) |
| (3,4-Epoxycyclohexyl)methyl 3,4-epoxycyclohexanecarboxylate | 10 parts | (30.3%) |
| Alkyl glycidyl ether in which alkyl groups are predominantly dodecyl and tetradecyl | 3 parts | (9.1%) |
| | 33 parts | (100.0%) |
| p-Chlorobenzenediazonium hexafluorophosphate | 0.33 parts (0.97% of the total weight) | |
| 10% solution of poly(1-vinyl-2-pyrrolidinone) in propylene carbonate | 0.66 parts (1.94% of the total weight) | |

The poly(1-vinyl-2-pyrrolidinone) solution provided 0.19% of the total weight of that polymer dissolved in propylene carbonate, a nonvolatile solvent making up 1.75% of the total weight. The poly(1-vinyl-2-pyrrolidinone) had an average molecular weight of approximately 40,000. The beneficial effect of such small proportion of a polymerized 1-vinyl-2-pyrrolidinone in inhibiting premature gelation of polymerizable epoxide compositions is disclosed and claimed in my application Ser. No. 144,642 now U.S. Pat. No. 3,721,617 issued Mar. 20, 1973, filed concurrently herewith and assigned to the same assignee as that of the present invention. The viscosity of the composition when freshly formulated as indicated in the preceding tabulation was about 500 cps at 23°C.

This composition was applied to the surface of paper on a web-fed gravure coater, and the coating was cured by passage under four 1,200-watt mercury arcs at a speed of 1,200 feet per minute to provide a hard, nontacky finish.

EXAMPLE 26

An epoxide formulation suitable for application as a varnish to substrate surfaces is formulated by mixing the following materials:

| | | | |
|---|---|---|---|
| Epoxy phenol novolak | 850 | g | (68.0%) |
| (3,4-Epoxycyclohexyl)methyl 3,4-epoxycyclohexanecarboxylate | 280 | g | (22.4%) |
| Alkyl glycidyl ether in which alkyl groups are predominantly dodecyl and tetradecyl | 120 | g | (9.6%) |
| | 1,250 | g | (100.0% of the blend, or 98.5% of the total weight) |
| Silicone surfactant | 6 | g | (0.45%) |
| Mineral oil (liquid petrolatum) | 10 | g | (0.8%) |
| | 1,266 | g | |
| p-Chlorobenzenediazonium hexafluorophosphate | 12.66 | g | (0.97%) |
| Poly(1-vinyl-2-pyrrolidinone) | 3.62 | g | (0.28%) |
| Propylene carbonate | 21.72 | g | (1.65%) |
| | 1,304.00 | g | (100.00%) |

The epoxidized novolak used in the above formulation was a product specified to maintain a viscosity at 52°C within the range of 1,400 to 2,000 cps and an epoxy equivalent weight between 172 and 179. The viscosity of the mixture of three epoxides listed first hereinabove closely approximated 2,500 cps at 23°C, which decreased to 2,455 cps upon addition of the silicone. The last-mentioned three components listed above were provided by adding 38 g of a solution formed by dissolving 20 g of the polyvinylpyrrolidinone and 70 g of the arenediazonium complex salt in 100 ml (120 g) of propylene carbonate; alternatively, to obtain the same composition, there could be added separately, to the 1,266 g of epoxide blend, 1% by weight of the solid diazonium salt catalyst and 2% by weight of a 14.3% solution of polyvinylpyrrolidinone in propylene carbonate.

The varnish as described above was applied on a 60-inch Miehle dry offset sheet-fed press to coat paper sheets of 39 inch by 60 inch size at a rate of 5,000 impressions per hour. The coating thus provided on the sheets was cured to a non-tacky finish by passing the sheets at press speed beneath high pressure mercury arcs.

It was noted hereinabove, with reference to Example 1, that the epoxide blend there described, consisting of a polyglycidyl ether of a polyhydric alcohol and a bis-(epoxycycloalkyl) ester, is particularly useful for coating or printing on the surfaces of metal substrates. Example 2 illustrates a similar composition. It appears further from Examples 3, 4, 16, and 17 that the epoxidic prepolymer material in such metal coating compositions advantageously may be selected from the group consisting not only of such a polyglycidyl ether of a polyhydric alcohol, but also of a diepoxide of a cycloalkyl or alkylcycloalkyl hydrocarbon or ether.

Referring again to Example 25, coated or printed matter is applied on a gravure press to at least predetermined areas of the surface of a paper substrate, for example to form a continuous glossy coating on the resulting paper product. For gravure printing or decoration, it may be desired to modify the formulation appropriately, in a manner suggested hereinabove, by inclusion therein of some pigment and preferably somewhat higher proportions of the less viscous epoxide materials.

Referring further to Example 26, the epoxide polymer is coated or imprinted on a substrate by applying a portion of the polymerizable mixture on a dry offset press to at least predetermined areas of the surface of the substrate, followed by irradiation. In such a press the polymerizable composition passes from a fountain down a train of distribution rollers for transfer to a roller having a solid raised surface (for coating) or raised image areas (for printing), followed by transfer to a rubber offset roller, from which the composition is deposited onto the substrate. As mentioned above, the composition may be applied by this means to a paper substrate to produce a coated or imprinted paper product. The same formulation is utilized alternatively, to produce such a paper product, by applying a portion of the formulation, with or without added pigment, on letterpress apparatus directly to at least predetermined areas of the surface of a paper substrate.

With reference to the coating or printing process using a dry offset press, and also to the abovedescribed process for coating or printing on a paper substrate whether on a dry offset press or on letterpress apparatus or a gravure press, it has been found to be preferable to utilize, as the prepolymer resin material, primarily prepolymers of the type of the diglycidyl ether of bisphenol A and the epoxidized novolaks. Epoxide blends utilizing these prepolymer resins are illustrated in a number of the examples set forth hereinabove. When the epoxide materials also include a polyglycidyl ether of a polyhydric alcohol, or a diepoxide of a cycloalkyl hydrocarbon or ether, the sum of the weights of such polyglycidyl ether or cycloalkyl diepoxide present should not exceed about 10% of the total weight of the prepolymer material present. Compositions of the latter type are illustrated in the above Examples 19–24.

While there have been described particular embodiments of the invention, including those at present considered to be the preferred embodiments, it will be obvious to those skilled in the art that various changes and modifications may be made therein without departing from the invention, and it is aimed, therefore, to cover in the appended claims all such changes and modifications as fall within the true spirit and scope of the invention.

I claim:

1. The process of producing an epoxide polymer, comprising:
   forming an essentially solventless mixture, fluid at room temperature, consisting essentially of
   1. at least one epoxidic prepolymer material having an epoxy equivalent weight below 200, constituting between about 10% and 85% of the weight of the epoxidic materials in the mixture, and selected from the group consisting of
      A. an epoxy resin prepolymer consisting predominantly of the monomeric diglycidyl ether of bisphenol A,
      B. a polyepoxidized phenol novolak or cresol novolak,
      C. a polyglycidyl ether of a polyhydric alcohol, and
      D. a diepoxide of a cycloalkyl or alkylcycloalkyl hydrocarbon or ether,
   2. an epoxidic ester having two epoxycycloalkyl groups and constituting at least about 15% of the weight of the epoxidic materials in the mixture, and
   3. radiation-sensitive catalyst precursor which decomposes upon exposure to electron beam or electromagnetic irradiation to provide a Lewis acid effective to initiate polymerization of said epoxidic materials in said mixture;
   applying a portion of the mixture so formed to a substrate
   and subsequently exposing said mixture on the substrate to electron beam or electromagnetic irradiation to effect substantial polymerization of said epoxidic materials.

2. The process of claim 1 for producing an epoxide polymer, in which said catalyst precursor as present upon forming said mixture constitutes between 0.1% and 5% of the weight of the mixture.

3. The process of claim 1 for producing an epoxide polymer, in which said catalyst precursor as mixed with said epoxidic materials constitutes between about 0.5% and about 2% of the weight of the resulting mixture.

4. The product produced by the process of claim 1.

5. The process of producing an epoxide polymer, comprising:
forming an essentially solventless mixture, fluid at room temperature, consisting essentially of
1. at least one epoxidic prepolymer material having an epoxy equivalent weight below 200, constituting between about 10% and 85% of the weight of the epoxidic materials in the mixture, and selected from the group consisting of
   A. an epoxy resin prepolymer consisting predominantly of the monomeric diglycidyl ether of bisphenol A,
   B. a polyepoxidized phenol novolak or cresol novolak,
   C. a polyglycidyl ether of a polyhydric alcohol, and
   D. a diepoxide of a cycloalkyl or alkylcycloalkyl hydrocarbon or ether,
2. an epoxidic ester having two epoxycycloalkyl groups and constituting at least about 15% of the weight of the epoxidic materials in the mixture,
3. a monoepoxide having a viscosity at 23°C of less than 20 centipoises and constituting up to about 15% of the weight of the epoxidic materials in the mixture, and
4. a radiation-sensitive catalyst precursor which decomposes upon exposure to electron beam or electromagnetic irradiation to provide a Lewis acid effective to initiate polymerization of said epoxidic materials in said mixture;
applying a portion of the mixture so formed to a substrate;
and subsequently exposing said mixture on the substrate to electron beam or electromagnetic irradiation to effect substantial polymerization of said epoxidic materials.

6. The product produced by the process of claim 5.

7. The process of claim 5 for producing an epoxide polymer, in which the catalyst precursor as present upon forming said mixture constitutes between 0.1% and 5% of the weight of the mixture.

8. The process of claim 5 for producing an epoxide polymer, in which the cationic initiator in said mixture is a radiation-sensitive catalyst precursor in the form of an aromatic diazonium salt of a complex halogenide, which decomposes upon said exposure to irradiation to release a halide Lewis acid effective to initiate substantial polymerization of the epoxidic materials in the mixture.

9. The process of claim 8, in which said catalyst precursor as mixed with said epoxidic materials constitutes between 0.1% and 5% of the weight of the resulting mixture.

10. The process of claim 9, in which said catalyst precursor as mixed with said epoxidic materials constitutes between about 0.5% and about 2% of the weight of the resulting mixture.

11. The process of claim 5 for producing an epoxide polymer, in which the catalyst precursor in said mixture is a radiation-sensitive catalyst precursor in the form of p-chlorobenzenediazonium hexafluorophosphate.

12. The process of claim 5 for producing an epoxide polymer, in which the catalyst precursor in said mixture is a radiation-sensitive catalyst precursor in the form of 2,5-diethoxy-4-(p-tolylthio)benzenediazonium hexafluorophosphate.

13. The process of claim 5 for producing an epoxide polymer, in which the epoxidic prepolymer material in said mixture is made up in major part of an epoxy resin prepolymer consisting substantially of the monomeric glycidyl ether of bisphenol A.

14. The process of claim 13, in which the epoxidic prepolymer material in said mixture consists of an epoxy resin prepolymer in the form substantially of the monomeric glycidyl ether of bisphenol A.

15. The process of claim 5 for producing an epoxide polymer, in which the epoxidic prepolymer material in said mixture is made up in major part of a polyepoxidized phenol novolak or cresol novolak.

16. The process of claim 15, in which the epoxidic prepolymer material in said mixture consists of a polyepoxidized phenol novolak or cresol novolak.

17. The process of claim 5, in which the epoxidic prepolymer material in said mixture consists of a polyglycidyl ether of a polyhydric alcohol.

18. The process of claim 5, in which the epoxidic prepolymer material in said mixture consists of a diepoxide of a cycloalkyl or alkylcycloalkyl hydrocarbon or ether.

19. The process of claim 5 for producing an epoxide polymer, in which said ester having two epoxycycloalkyl groups in said mixture is (3,4-epoxycyclohexyl)methyl 3,4-epoxycyclohexanecarboxylate.

20. The process of claim 5 for producing an epoxide polymer, in which said ester having two epoxycycloalkyl groups in said mixture is bis[(3,4-epoxy-6-methylcyclohexyl)methyl] adipate.

21. The product produced by the process of claim 8.

22. The process of producing a coated or imprinted paper product, comprising:
forming an essentially solventless mixture, fluid at room temperature, consisting essentially of
1. at least one epoxidic prepolymer material having an epoxy equivalent weight below 200, constituting between about 10% and 85% of the weight of the epoxidic materials in the mixture, and selected from the group consisting of
   A. an epoxy resin prepolymer consisting predominantly of the monomeric diglycidyl ether of bisphenol A,
   B. a polyepoxidized phenol novolak or cresol novolak,
   C. a polyglycidyl ether of a polyhydric alcohol, and
   D. a diepoxide of a cycloalkyl or alkylcycloalkyl hydrocarbon or ether,
wherein the sum of the weights of any such polyglycidyl ether of a polyhydric alcohol (C) and of any such diepoxide of a cycloalkyl or alkylcycloalkyl hydrocarbon or ether (D) present does not exceed about 10% of the total weight of said epoxidic prepolymer materials present,
2. an epoxidic ester having two epoxycycloalkyl groups and constituting at least about 15% of the weight of the epoxidic materials in the mixture,
3. a monoepoxide having a viscosity at 23°C of less than 20 centipoises and constituting up to about 15% of the weight of the epoxidic materials in the mixture, and
4. a radiation-sensitive catalyst precursor which decomposes upon exposure to electron beam or electromagnetic irradiation to provide a Lewis acid effective to initiate polymerization of said epoxidic materials in said mixture;

applying on letterpress apparatus a portion of the mixture so formed to at least predetermined areas of the surface of a paper substrate;

and subsequently exposing said mixture on the paper substrate to electron beam or electromagnetic irradiation to release said Lewis acid in sufficient amounts to effect substantial polymerization of said epoxidic materials.

23. The coated or imprinted paper product produced by the process of claim 22.

24. The process of producing an epoxide polymer coated or imprinted on a substrate, comprising:
    forming an essentially solventless mixture, fluid at room temperature, consisting essentially of
    1. at least one epoxidic prepolymer material having an epoxy equivalent weight below 200, constituting between about 10% and 85% of the weight of the epoxidic materials in the mixture, and selected from the group consisting of
        A. an epoxy resin prepolymer consisting predominantly of the monomeric diglycidyl ether of bisphenol A,
        B. a polyepoxidized phenol novolak or cresol novolak,
        C. a polyglycidyl ether of a polyhydric alcohol, and
        D. a diepoxide of a cycloalkyl or alkylcycloalkyl hydrocarbon or ether,
    wherein the sum of the weights of any such polyglycidyl ether of a polyhydric alcohol (C) and of any such diepoxide of a cycloalkyl or alkylcycloalkyl hydrocarbon or ether (D) present does not exceed about 10% of the total weight of said epoxidic prepolymer materials present,
    2. an epoxidic ester having two epoxycycloalkyl groups and constituting at least about 15% of the weight of the epoxidic materials in the mixture,
    3. a monoepoxide having a viscosity at 23°C of less than 20 centipoises and constituting up to about 15% of the weight of the epoxidic materials in the mixture; and
    4. a radiation-sensitive catalyst precursor which decomposes upon exposure to electron beam or electromagnetic irradiation to provide a Lewis acid effective to initiate polymerization of said epoxidic materials in said mixture;

applying on a dry offset press a portion of the mixture so formed to at least predetermined areas of the surface of said substrate;

and subsequently exposing said mixture on the substrate to electron beam or electromagnetic irradiation to release said Lewis acid in sufficient amounts to effect substantial polymerization of said epoxidic materials.

25. The coated or imprinted product produced by the process of claim 24.

26. The process of producing a coated or imprinted paper product, comprising:
    forming an essentially solventless mixture, fluid at room temperature, consisting essentially of
    1. at least one epoxidic prepolymer material having an epoxy equivalent weight below 200, constituting between about 10% and 85% of the weight of the epoxidic materials in the mixture, and selected from the group consisting of
        A. an epoxy resin prepolymer consisting predominantly of the monomeric diglycidyl ether of bisphenol A,
        B. a polyepoxidized phenol novolak or cresol novolak,
        C. a polyglycidyl ether of a polyhydric alcohol, and
        D. a diepoxide of a cycloalkyl or alkylcycloalkyl hydrocarbon or ether,
    wherein the sum of the weights of any such polyglycidyl ether of a polyhydric alcohol (C) and of any such diepoxide of a cycloalkyl or alkylcycloalkyl hydrocarbon or ether (D) present does not exceed about 10% of the total weight of said epoxidic prepolymer materials present,
    2. an epoxidic ester having two epoxycycloalkyl groups and constituting at least about 15% of the weight of the epoxidic materials in the mixture,
    3. a monoepoxide having a viscosity at 23°C of less than 20 centipoises and constituting up to about 15% of the weight of the epoxidic materials in the mixture, and
    4. a radiation-sensitive catalyst precursor which decomposes upon exposure to electron beam or electromagnetic irradiation to provide a Lewis acid effective to initiate polymerization of said epoxidic materials in said mixture;

applying on a dry offset press a portion of the mixture so formed to at least predetermined areas of the surface of a paper substrate;

and subsequently exposing said mixture on the paper substrate to electron beam or electromagnetic irradiation to release said Lewis acid in sufficient amounts to effect substantial polymerization of said epoxidic materials.

27. The coated or imprinted paper product produced by the process of claim 26.

28. The process of producing a coated or imprinted paper product, comprising:
    forming an essentially solventless mixture, fluid at room temperature, consisting essentially of
    1. at least one epoxidic prepolymer material having an epoxy equivalent weight below 200, constituting between about 10% and 85% of the weight of the epoxidic materials in the mixture, and selected from the group consisting of
        A. an epoxy resin prepolymer consisting predominantly of the monomeric diglycidyl ether of bispenol A.
        B. a polyepoxidized phenol novolak or cresol novolak,
        C. a polyglycidyl ether of a polyhydric alcohol, and
        D. a diepoxide of a cycloalkyl or alkylcycloalkyl hydrocarbon or ether,
    wherein the sum of the weights of any such polyglycidyl ether of a polyhydric alcohol (C) and of any such diepoxide of a cycloalkyl or alkylcycloalkyl hydrocarbon or ether (D) present does not exceed about 10% of the total weight of said epoxidic prepolymer materials present,
    2. an epoxidic ester having two epoxycyloalkyl groups and constituting at least about 15% of the weight of the epoxidic materials in the mixture,
    3. a monoepoxide having a viscosity at 23°C of less than 20 centipoises and constituting from about 2% to about 15% of the weight of the epoxidic materials in the mixture, and 4. a radiation-sensitive catalyst precursor which decomposes upon exposure to electron beam or electromagnetic irradiation to provide a Lewis acid effective to initiate polymerization of said epoxidic materials in said mixture;

applying on a gravure press a portion of the mixture so formed to at least predetermined areas of the surface of said paper substrate;

and subsequently exposing said mixture on the paper substrate to electron beam or electromagnetic irradiation to release said Lewis acid in sufficient amounts to effect substantial polymerization of said epoxidic materials.

29. The coated or imprinted paper product produced by the process of claim 28.

30. The process of producing a coated or imprinted metal product, comprising:

forming an essentially solventless mixture, fluid at room temperature, consisting essentially of
1. at least one epoxidic prepolymer material having an epoxy equivalent weight below 200, constituting between about 10% and 85% of the weight of the epoxidic materials in the mixture, and selected from the group consisting of
a polyglycidyl ether of a polyhydric alcohol and a diepoxide of a cycloalkyl or alkylcycloalkyl hydrocarbon or ether,
2. an epoxidic ester having two epoxycycloalkyl groups and constituting at least about 15% of the weight of the epoxidic materials in the mixture,
3. a monoepoxide having a viscosity at 23°C of less than 20 centipoises and constituting up to about 15% of the weight of the epoxidic materials in the mixture, and
4. a radiation-sensitive catalyst precursor which decomposes upon exposure to electron beam or electromagnetic irradiation to provide a Lewis acid effective to initiate polymerization of said epoxidic materials in said mixture;

applying a portion of the mixture so formed to at least predetermined areas of the surface of a metal substrate;

and subsequently exposing said mixture on the paper substrate to electron beam or electromagnetic irradiation to release said Lewis acid in sufficient amounts to effect substantial polymerization of said epoxidic materials.

31. The coated or imprinted metal product produced by the process of claim 30.

32. The process of claim 1, in which said electromagnetic irradiation is actinic irradiation.

33. The process of claim 1 in which said irradiation is electron beam irradiation.

* * * * *